(12) United States Patent
Fukushima et al.

(10) Patent No.: US 9,524,914 B2
(45) Date of Patent: Dec. 20, 2016

(54) METHOD OF MANUFACTURING ORGANIC EL DISPLAY APPARATUS, AND INSPECTION APPARATUS

(71) Applicant: JOLED INC., Tokyo (JP)

(72) Inventors: Miki Fukushima, Tokyo (JP); Kazushi Sugiyama, Hyogo (JP); Toshiyuki Kato, Tokyo (JP); Yasunori Negoro, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/027,313

(22) PCT Filed: May 7, 2014

(86) PCT No.: PCT/JP2014/002417
§ 371 (c)(1),
(2) Date: Apr. 5, 2016

(87) PCT Pub. No.: WO2015/056365
PCT Pub. Date: Apr. 23, 2015

(65) Prior Publication Data
US 2016/0247734 A1     Aug. 25, 2016

(30) Foreign Application Priority Data
Oct. 15, 2013   (JP) .................................. 2013-215035

(51) Int. Cl.
*H01L 51/56*   (2006.01)
*H01L 21/66*   (2006.01)
(Continued)

(52) U.S. Cl.
CPC ............... *H01L 22/24* (2013.01); *G09G 3/006* (2013.01); *H01L 23/544* (2013.01);
(Continued)

(58) Field of Classification Search
CPC ...................................................... H01L 51/56
(Continued)

(56) References Cited

U.S. PATENT DOCUMENTS

| | | | |
|---|---|---|---|
| 8,647,163 B2 * | 2/2014 | Miyazawa | H01L 51/56 445/2 |
| 8,687,874 B2 * | 4/2014 | Hiraoka | H01L 51/56 382/149 |

(Continued)

FOREIGN PATENT DOCUMENTS

| | | |
|---|---|---|
| JP | 06-250138 | 9/1994 |
| JP | 2006-058083 | 3/2006 |
| JP | 2010-266502 | 11/2010 |

OTHER PUBLICATIONS

Search Report issued in Patent Application No. PCT/JP2014/002417 dated Jul. 15, 2014.

*Primary Examiner* — Cuong Q Nguyen
(74) *Attorney, Agent, or Firm* — Greenblum & Bernstein, P.L.C.

(57) ABSTRACT

A method of manufacturing an organic EL display apparatus including an organic EL panel having light emitting pixels each of which has an organic EL element (OEL) includes: lighting up lighting target pixels set from among the light emitting pixels; causing an imaging device to photograph the organic EL panel and receiving a photographed image from the imaging device; detecting the lighting target pixels using the photographed image; determining whether an undetectable pixel that cannot be detected is included among the lighting target pixels, using a result obtained in the detecting; increasing an amount of luminescence of the undetectable pixel to a detectable amount of luminescence, when it is determined that the undetectable pixel is included;
(Continued)

and aligning a relative position of the organic EL display apparatus and the imaging device, using the result obtained in the detecting.

10 Claims, 8 Drawing Sheets

(51) Int. Cl.
  *H01L 27/32* (2006.01)
  *H01L 23/544* (2006.01)
  *G09G 3/00* (2006.01)
(52) U.S. Cl.
  CPC *H01L 27/3244* (2013.01); *H01L 2223/54426* (2013.01); *H01L 2227/323* (2013.01)
(58) Field of Classification Search
  USPC ............................... 257/431–448; 438/4, 16
  See application file for complete search history.

(56) References Cited

U.S. PATENT DOCUMENTS

| | | |
|---|---|---|
| 2006/0038581 A1 | 2/2006 | Kanai |
| 2013/0200479 A1* | 8/2013 | Sakano ............... H01L 31/0216 438/73 |

* cited by examiner

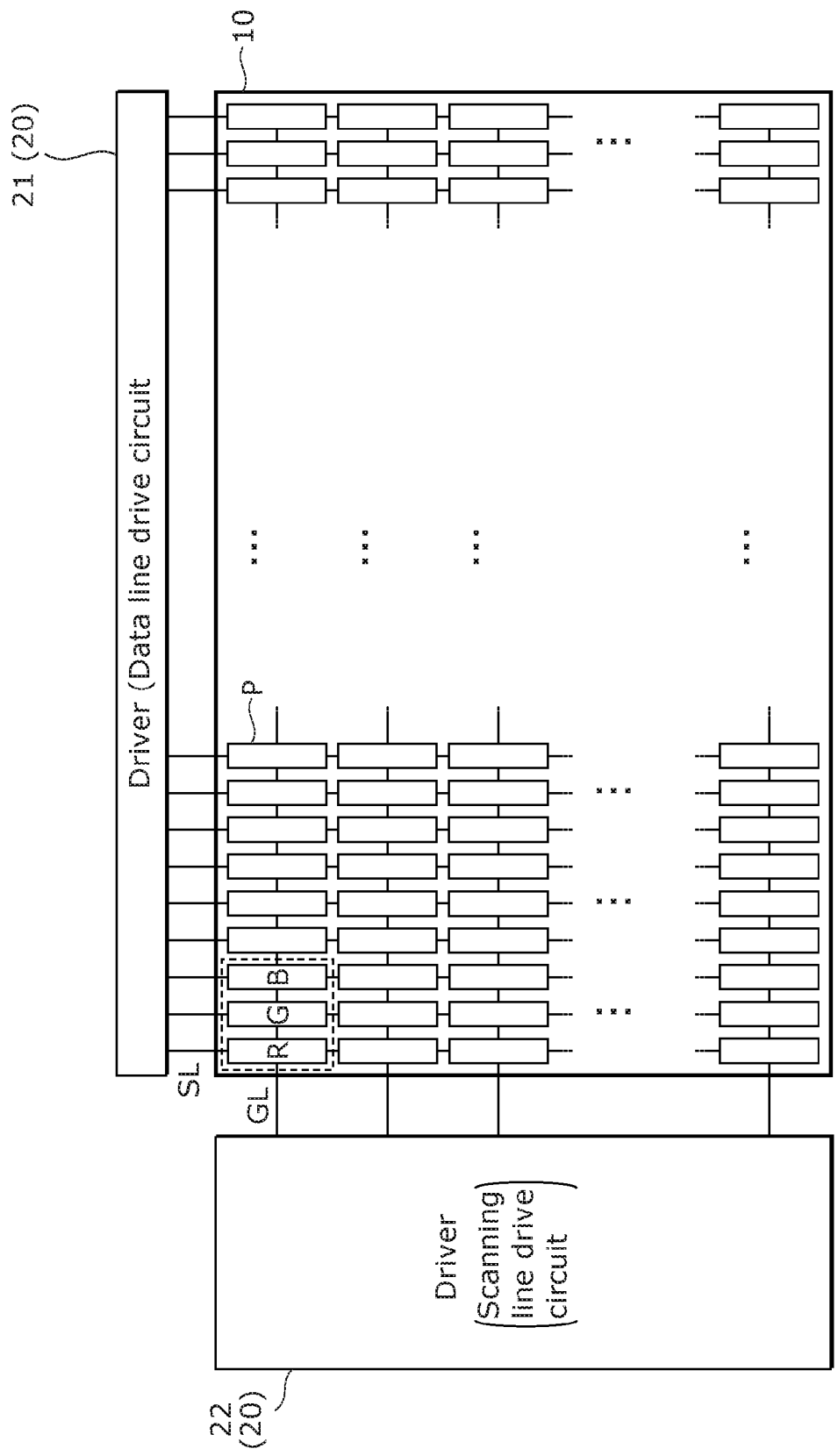

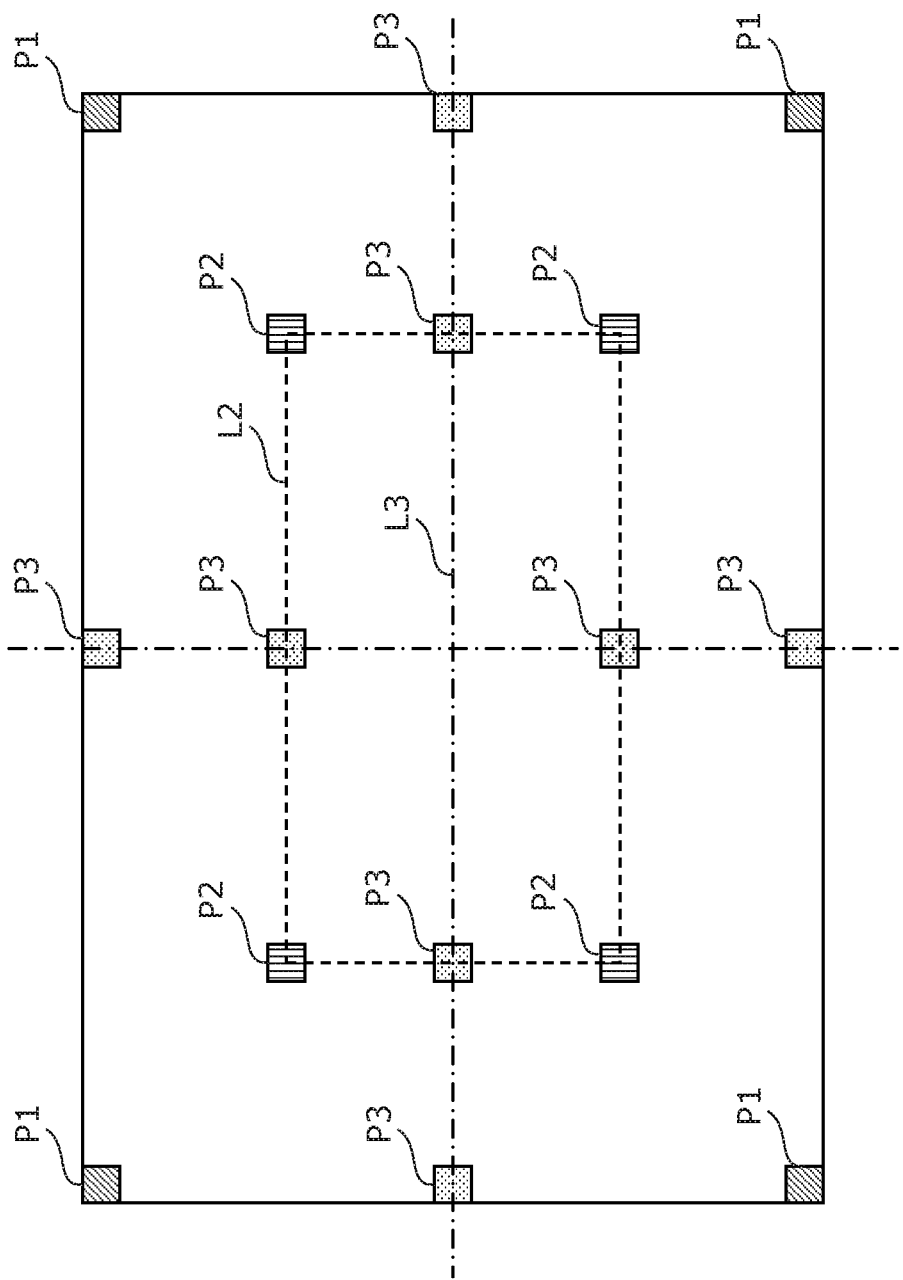

METHOD OF MANUFACTURING ORGANIC EL DISPLAY APPARATUS, AND INSPECTION APPARATUS

TECHNICAL FIELD

The present disclosure relates to a method of manufacturing an organic electroluminescent (EL) display apparatus and to an inspection apparatus.

BACKGROUND ART

As an image display apparatus including current-driven light emitting elements, an organic electroluminescent (EL) display (organic EL display apparatus) including organic EL elements is known. Such an organic EL display is excellent in viewing angle characteristics and has the advantage of low power consumption. The organic EL display typically includes a plurality of light emitting pixels arranged in a matrix. Each light emitting pixel includes an organic EL element, a drive transistor for driving the organic EL element, and a selection transistor for switching the state of the light emitting pixel between Selected and Unselected.

A manufacturing process of the organic EL display includes an inspection of an organic EL panel.

The inspection of the organic EL panel includes, for example, a lighting inspection performed to detect and correct luminance unevenness (unevenness in the amount of luminescence) of the organic EL panel after a driver is mounted on the organic EL panel. The luminance unevenness refers to a phenomenon in which, even with the same luminance signal provided to all the light emitting pixels, the light emitting pixels are not uniform in the amount of luminescence and thereby cause unevenness.

In the lighting inspection, the luminance unevenness can be detected by a technique of, for example, actually lighting up the organic panel, photographing this organic EL panel using an imaging device, and calculating luminance values (corresponding to the amounts of luminescence) using the photographed image from the imaging device (see Patent Literature (PTL) 1, for example).

After the detection of the luminance unevenness, the luminance value (corresponding to the amount of luminescence) is used to calculate, for each of the light emitting pixels, a correction amount of the luminance signal to allow the corrected amount of luminescence of the light emitting pixel to be a predetermined amount of luminescence, for example. This can thus reduce the luminance unevenness caused to the assembled organic EL panel. Examples of the predetermined amount of luminescence include a predetermined fixed value and a mean value.

CITATION LIST

Patent Literature

[PTL 1] Japanese Unexamined Patent Application Publication No. 2006-58083

SUMMARY OF INVENTION

Technical Problem

However, when the imaging device is used to photograph the organic EL panel as in the aforementioned lighting inspection in the manufacturing process of the organic EL panel, it is desirable to more favorably align a relative position of the imaging device and the organic EL panel to perform an inspection or the like more favorably.

In view of this, the present disclosure provides an inspection apparatus and a method of manufacturing an organic EL display apparatus, which enable a relative position of an imaging device and an organic EL panel to be aligned more favorably.

Solution to Problem

A method of manufacturing an organic EL display apparatus according to an aspect of the present disclosure is a method of manufacturing an organic EL display apparatus that includes a display panel having light emitting pixels each of which has a light emitting element, the method including: lighting up lighting target pixels set from among the light emitting pixels; causing an imaging device to photograph the display panel and receiving a photographed image from the imaging device; detecting the lighting target pixels using the photographed image; determining whether an undetectable pixel that cannot be detected is included among the lighting target pixels, using a result obtained in the detecting of the lighting target pixels; increasing an amount of luminescence of the undetectable pixel to an amount of luminescence detectable in the detecting of the lighting target pixels, when it is determined that the undetectable pixel is included; and aligning a relative position of the organic EL display apparatus and the imaging device, using the result obtained in the detecting of the lighting target pixels.

Advantageous Effects of Invention

According to an inspection apparatus and a method of manufacturing an organic EL display apparatus according to the present disclosure, it is possible to align more favorably a relative position of an imaging device and an organic EL panel.

BRIEF DESCRIPTION OF DRAWINGS

FIG. 2 is a diagram showing an example of the organic EL panel with a driver mounted thereon.

FIG. 7 is a diagram showing an example of a setting of lighting target pixels.

DESCRIPTION OF EMBODIMENTS (Underlying Knowledge Forming Basis of the Present Disclosure)

The inventors have found that the following problem is caused in the processing for aligning a relative position of an imaging device and an organic EL panel as described in "Background Art" (hereafter, the processing is referred to as the "alignment" as appropriate).

The luminance unevenness among light emitting pixels does not much matter for, for example, a liquid crystal display in which a backlight is used. However, the luminance unevenness relatively tends to matter for an organic EL display (an organic EL display apparatus), which includes an organic EL element for each light emitting pixel.

Figure 1A:
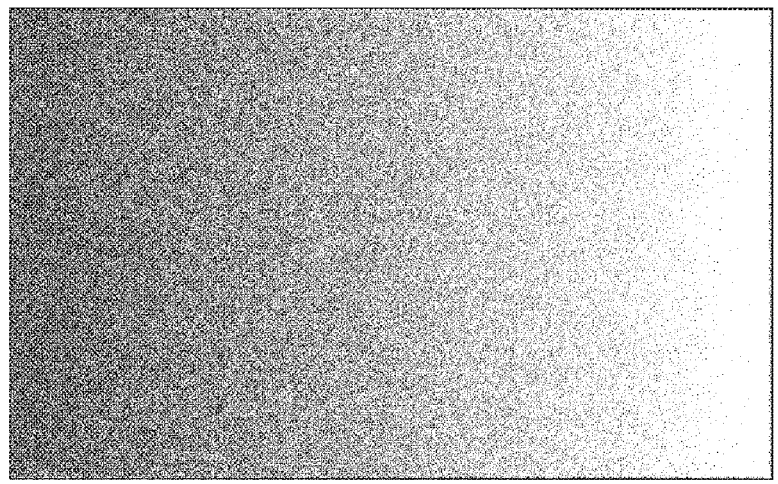
FIG. 1A is a diagram showing an example of luminance unevenness of an organic EL panel (component).

FIG. 1A is a diagram showing an example of luminance unevenness of an organic EL panel. The amount of luminescence of the organic EL panel shown in FIG. 1A is large on the right-hand part in the diagram and relatively small on the left-hand part in the diagram.

To avoid this, a lighting inspection for example is performed on the organic EL display to make all light emitting pixels uniform in the amount of luminescence. As described above, the lighting inspection is achieved by detecting the luminance unevenness of the organic EL panel, calculating the amount of correction for the luminance signal for each of the light emitting pixels to make all the light emitting pixels uniform in the amount of luminescence when all these pixels receive the same luminance signal, and storing the calculated amount of correction into an integrated circuit (IC) mounted on the organic EL display.

Here, as described above, the organic EL panel is photographed to detect the luminance unevenness in the lighting inspection.

For example, an imaging device including a charge-coupled device (CCD) having a plurality of photoreceptors is used to photograph the organic EL panel.

To photograph the organic EL panel favorably, the CCD needs to be aligned with the organic EL panel properly. To achieve such alignment, each of the light emitting pixels making up the organic EL panel is made to correspond to a single photoreceptor. In other words, the alignment is performed not to allow more than one light emitting pixel to correspond to a single photoreceptor.

In the alignment, after an alignment mark is detected, the position of the CCD is determined so that the alignment mark is positioned in a predetermined position.

A specific pattern formed on the organic EL panel is conventionally used as the alignment mark. However, since a frame part of an organic panel tends to be downsized in the field of displays in recent years, it is difficult to allocate an area to form this specific pattern.

With this being the situation, one known method is to cause, among all the light emitting pixels making up an organic EL panel, four light emitting pixels located at four corners of the organic EL panel to light up as lighting target pixels, which are thus used as the alignment marks. With this method, the use of the actual light emitting pixels as the alignment marks enables the alignment to be performed more accurately than when the specific pattern formed on the organic EL panel is used.

Here, the lighting inspection is performed only to calculate the amount of correction to be made to the amount of luminescence before the amount of luminescence of the organic EL panel is corrected. This means that the luminance unevenness of the lighting target pixels has yet to be corrected. Moreover, in the alignment performed using the lighting target pixels, the passage of a large current through the lighting target pixels is undesirable. On this account, the luminance signal is set to a luminance value of a certain degree (an intermediate value, for example) instead of the highest luminance value.

Here, assume that the lighting target pixels include a lighting target pixel darker than the others and that the same luminance signal is provided to all the lighting target pixels. In this case, there may be a lighting target pixel that cannot be detected (that is, an undetectable pixel) in the photographed image outputted from the imaging device. For example, although the four light emitting pixels located at the four corners are lit up as the lighting target pixels, the two lighting target pixels on the upper-left and lower-left corners are insufficient in the amount of luminescence as shown in FIG. 1A. As a result, these two lighting target pixels may not be detected.

Failure of detection of the lighting target pixel from the photographed image may interfere with the proper alignment.

To solve the aforementioned problem, a method of manufacturing an organic EL display apparatus according to an aspect of the present disclosure is a method of manufacturing an organic EL display apparatus that includes a display panel having light emitting pixels each of which has a light emitting element, the method including: lighting up lighting target pixels set from among the light emitting pixels; causing an imaging device to photograph the display panel and receiving a photographed image from the imaging device; detecting the lighting target pixels using the photographed image; determining whether an undetectable pixel that cannot be detected is included among the lighting target pixels, using a result obtained in the detecting of the lighting target pixels; increasing an amount of luminescence of the undetectable pixel to an amount of luminescence detectable in the detecting of the lighting target pixels, when it is determined that the undetectable pixel is included; and aligning a relative position of the organic EL display apparatus and the imaging device, using the result obtained in the detecting of the lighting target pixels.

With the aforementioned method of manufacturing an organic EL display apparatus, when an undetectable pixel, namely, an undetectable lighting target pixel, is present, the amount of luminescence of this undetectable pixel is increased to the amount detectable on the photographed image. This allows all the lighting target pixels to be detected, which in turn enables the alignment to be performed properly.

Moreover, since the aforementioned method of manufacturing an organic EL display apparatus enables the alignment to be performed favorably, the luminance value of the display apparatus can be corrected more properly. Thus, enhancement of image quality of the display apparatus can be expected.

For example, in the lighting up of lighting target pixels, four first light emitting pixels and an additional lighting target pixel may be set as the lighting target pixels, the four first light emitting pixels being located at four corners of the display panel and the additional lighting target pixel being located other than on a periphery of the display panel. In this case, for example, in the lighting up of lighting target pixels, when a rectangle smaller than the display panel is set in a center of the display panel, a second light emitting pixel included among the light emitting pixels and located at at least one of four corners of the rectangle may be set as the additional lighting target pixel. Moreover, in the lighting up of lighting target pixels, when a cross is set on the display panel, a freely-selected third light emitting pixel included among the light emitting pixels and located on the cross may be set as the additional lighting target pixel.

For example, a lens of an imaging device typically has aberration (such as distortion aberration).

Figure 1B:
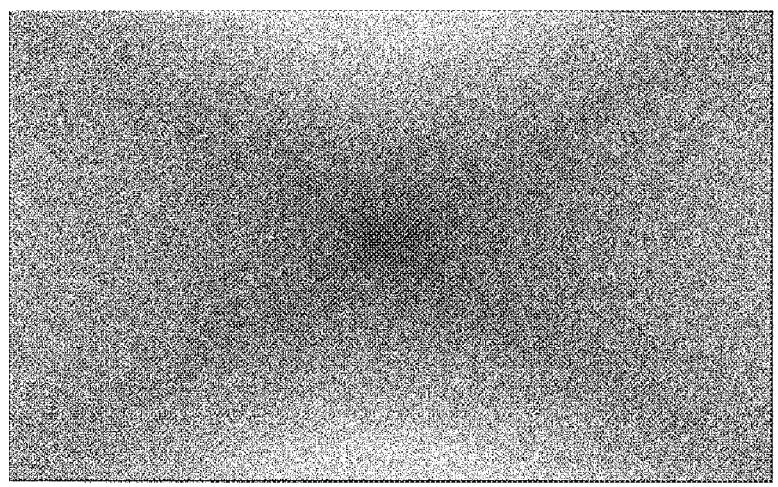
FIG. 1B is a diagram showing an example of an influence caused by lens aberration of an imaging device in alignment for the organic EL panel.
Figure 1C:
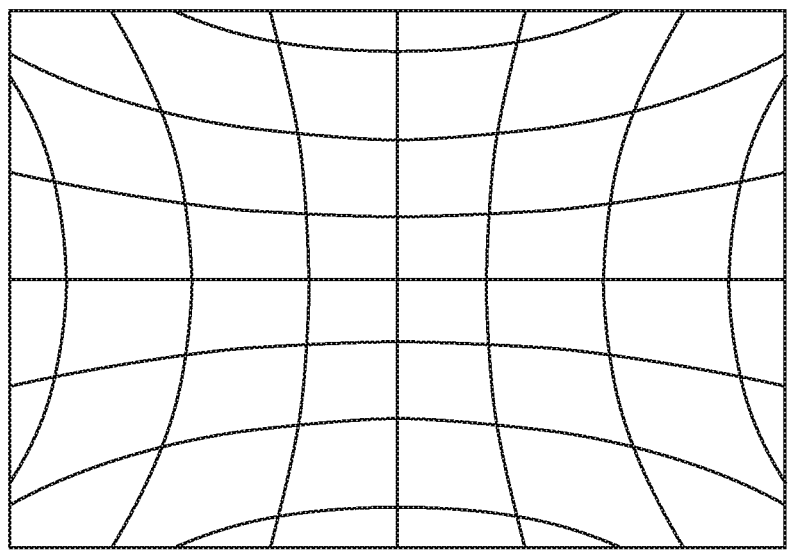
FIG. 1C is a diagram showing an example of an influence caused by lens aberration of the imaging device in alignment for the organic EL panel.

FIG. 1B is a diagram showing an example of lens aberration. FIG. 1C is a line drawing of an example of lens aberration. In the examples shown in FIG. 1B and FIG. 1C, even when the actual detected positions of the light emitting pixels located at the four corners of the organic EL panel in the photographed image are not positionally displaced from the respective correct positions that should be detected, a positional displacement may be possibly caused in the central region of the organic EL panel. Here, recent years have seen the production of oversize organic EL panels. An oversize organic EL panel is more susceptible to the lens aberration of the imaging device than a relatively small organic EL panel.

It should be noted that only the light emitting pixels located at the four corners of the organic EL panel are conventionally used as the lighting target pixels, and that thus the positional displacement in the central region is not conventionally reflected. For this reason, the positional displacement may be caused to the central region of the organic EL panel.

To solve this problem, the aforementioned method of manufacturing an organic EL display apparatus enables the alignment to be performed more properly in accordance with the lens aberration by setting lighting target pixels in the central region of the display apparatus.

For example, in the determining, a lighting target pixel that is included among the lighting target pixels and has a luminance value not more than a predetermined threshold in the photographed image may be determined to be the undetectable pixel.

According to the aforementioned method of manufacturing an organic EL display apparatus, the threshold that is set properly enables the lighting target pixels to be detected properly.

For example, in the increasing of an amount of luminescence of the undetectable pixel, a luminance value of the undetectable pixel may be increased by a predetermined constant increment, and until it is determined in the determining that the undetectable pixel is not present, the increasing of an amount of luminescence, the causing of an imaging device to photograph the display panel, the detecting of the lighting target pixels, and the determining may be repeated in stated order.

According to the aforementioned method of manufacturing an organic EL display apparatus, all the lighting target pixels can be detected. In other words, the luminance signal is increased by a constant increment until no undetectable pixel is present. This can simplify the apparatus configuration (the program structure) of the inspection apparatus.

For example, the aligning of a relative position may be performed after it is determined in the determining that the undetectable pixel is not present.

According to the aforementioned method of manufacturing an organic EL display apparatus, the alignment is performed after all the lighting target pixels are detected. Thus, the alignment can be performed favorably.

For example, in the aligning of a relative position, the relative position may be determined to minimize, among all the lighting target pixels, a total amount of displacement between actual detected positions of the lighting target pixels in the photographed image and respective correct positions of the lighting target pixels in the photographed image.

According to the aforementioned method of manufacturing an organic EL display apparatus, the relative position is aligned to minimize, among all the lighting target pixels, the total amount of displacement between the actual detected positions of the lighting target pixels in the photographed image and the respective correct positions of the lighting target pixels. This enables the alignment to be performed properly.

Here, examples of the relative position alignment that is performed to minimize the total amount of displacement of the lighting target pixels include the following. As an example, the position of the imaging device with respect to the organic EL panel is determined to (i) equalize, among all the light emitting pixels, the amounts of displacement between the actual detected positions of the lighting target pixels and the respective correct positions of the lighting target pixels, or (ii) minimize a mean square error between the actual detected positions of the lighting target pixels and the respective correct positions of the lighting target pixels.

For example, the method further includes setting a substitute lighting target pixel for the undetectable pixel determined to be undetectable in the determining performed after the amount of luminescence of the undetectable pixel is increased to a highest amount in the increasing of an amount of luminescence of the undetectable pixel. The increasing of an amount of luminescence, the causing of an imaging device to photograph the display panel, the detecting of the lighting target pixels, and the determining may be performed for the substitute lighting target pixel.

With this structure, even when the undetectable pixel is a non-illuminated pixel that does not light up, the alignment can be performed accurately.

To solve the aforementioned problem, an inspection apparatus for an organic EL display apparatus according to an aspect of the present disclosure is an inspection apparatus for an organic EL display apparatus that includes a display panel having light emitting pixels each of which has a light emitting element, the inspection apparatus including: a signal generation unit that lights up lighting target pixels set from among the light emitting pixels; an imaging unit that causes an imaging device to photograph the display panel and receives a photographed image from the imaging device; a lighting-target-pixel detection unit that detects the lighting target pixels using the photographed image and determines, using a result obtained in the detection of the lighting target pixels, whether an undetectable pixel that cannot be detected is included among the lighting target pixels; and an alignment unit that aligns a relative position of the organic EL display apparatus and the imaging device, using the result obtained in the detection of the lighting target pixels, wherein when the lighting-target-pixel detection unit determines that the undetectable pixel is included, the signal generation unit increases an amount of luminescence of the undetectable pixel to an amount of luminescence detectable by the lighting-target-pixel detection unit.

This general and specific aspect may be implemented using a system, a method, an integrated circuit, a computer program, or a computer-readable recording medium such as a CD-ROM. Alternatively, the aspect may be implemented by any combination of systems, methods, integrated circuits, computer programs, and recording media.

Hereinafter, certain exemplary embodiments are described in detail with reference to the accompanying drawings.

It should be noted that each of the exemplary embodiments described below shows a general or specific example. The numerical values, shapes, materials, structural elements, the arrangement and connection of the structural elements, steps, the processing order of the steps, and so forth described in the following exemplary embodiments below are mere examples, and are not intended to limit the present disclosure. Furthermore, among the structural elements in the following exemplary embodiments below, structural elements not recited in any one of the independent claims indicating top concepts according to the present disclosure are described as arbitrary structural elements.

(Embodiment)

A method of manufacturing an organic EL display (an organic EL display apparatus) and an inspection apparatus are described, with reference to FIG. 2 to FIG. 7.

Embodiment describes the case where the method of manufacturing an organic EL display is applied to, among processes of manufacturing an organic EL display, a lighting inspection performed on an organic EL panel (an example of a display panel) that is a component of the organic EL display.

The lighting inspection includes the following: an alignment process of aligning an imaging device using lighting target pixels; and a correction process of calculating, after the alignment process, an amount of correction to be made to a luminance signal to make light emitting pixels uniform in the amount of luminescence. The execution of the lighting inspection can reduce luminance unevenness in the assembled organic EL display.

[1. Configuration of Driver-Mounted Organic EL Panel]

FIG. 2 is a diagram showing an example of the organic EL panel (component) with a driver mounted thereon. As shown in FIG. 2, an organic EL panel 10 in Embodiment includes a plurality of light emitting pixels P arranged in a matrix. Each of the light emitting pixels P corresponds to one of the primary colors, such as red (R), green (G), and blue (B). Note that the colors to which the light emitting pixels correspond are not limited to the primary colors.

The organic EL panel 10 is connected to a chip-on-film (COF) used as a driver 20, which includes a data line drive circuit 21 and a scanning line drive circuit 22.

The data line drive circuit 21 applies a voltage corresponding to an input luminance signal to a data line SL.

The scanning line drive circuit 22 applies a voltage to a scanning line GL to set the corresponding light emitting pixel P to Selected or Unselected.

Figure 3:
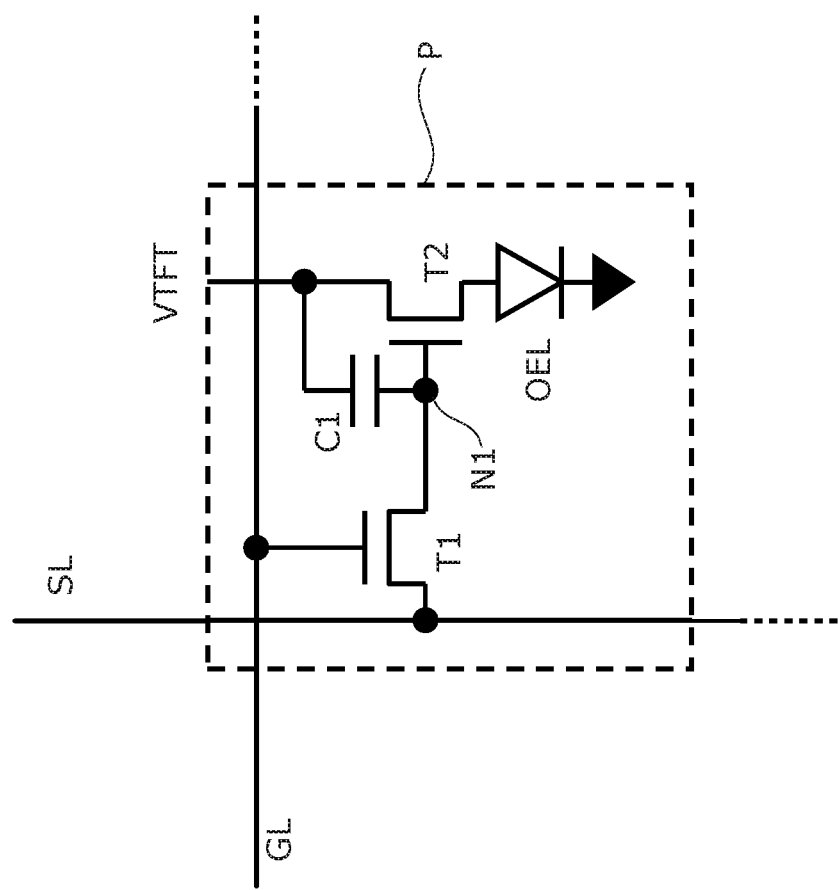
FIG. 3 is a diagram showing an example of a structure of a light emitting pixel.

FIG. 3 is a diagram showing an example of a structure of the light emitting pixel P. As shown in FIG. 3, the light emitting pixel P in Embodiment includes an organic EL element OEL, a selection transistor T1, a drive transistor T2, and a capacitive element C1.

The selection transistor T1 switches the state of the light emitting pixel P between Selected and Unselected. The selection transistor T1 is a thin film transistor (TFT) that has a gate terminal connected to the scanning line GL, a source terminal connected to the data line SL, and a drain terminal connected to a node N1.

The drive transistor T2 supplies the organic EL element OEL with a drive current corresponding to a value of the voltage of the data line SL. The drive transistor T2 is a thin film transistor that has a gate terminal connected to the node N1, a source terminal connected to an anode electrode of the organic EL element OEL, and a drain terminal supplied with a voltage VTFT.

The organic EL element OEL is a light emitting element that emits light according to a drive current. The drive current is supplied from the drive transistor T2. The organic EL element OEL has the anode electrode that is connected to the source terminal of the drive transistor T2, and a cathode electrode that is grounded.

The capacitive element C1 has one end connected to the node N1 and the other end connected to the drain terminal of the drive transistor T2.

The lighting inspection for the organic EL panel 10 with the driver 20 mounted thereon is performed by an inspection apparatus 30 (see FIG. 4) that is connected to the driver 20 of the organic EL panel 10.

[2. Inspection Apparatus]

Figure 4:
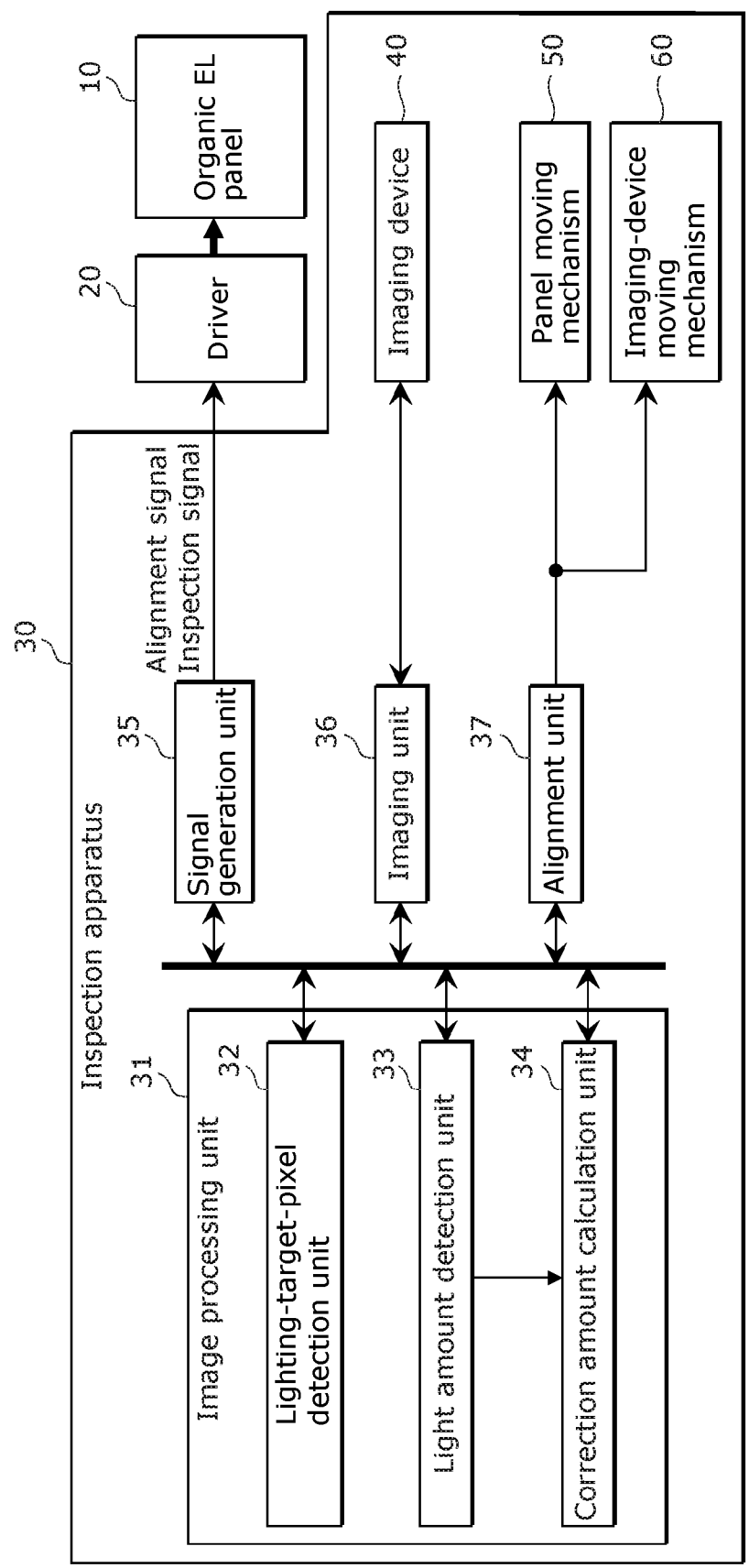
FIG. 4 is a block diagram showing an example of a configuration of an inspection apparatus in Embodiment.

FIG. 4 is a block diagram showing an example of a configuration of the inspection apparatus 30. As shown in FIG. 4, the inspection apparatus 30 includes an image processing unit 31, a signal generation unit 35, an imaging unit 36, an alignment unit 37, an imaging device 40, a panel moving mechanism 50, and an imaging-device moving mechanism 60.

The image processing unit 31 includes a lighting-target-pixel detection unit 32, a light amount detection unit 33, and a correction amount calculation unit 34. An operation performed by the image processing unit 31 is described later in detail.

The signal generation unit 35 is an interface that communicates with the driver 20 of the organic EL panel 10. An operation performed by the signal generation unit 35 is described later in detail.

The imaging unit 36 controls the imaging device 40 (such as requests for photographing and image obtainment). An operation performed by the imaging unit 36 is described later in detail.

The alignment unit 37 controls the panel moving mechanism 50 and the imaging-device moving mechanism 60 to align the imaging device 40 with respect to the organic EL panel 10. An operation performed by the alignment unit 37 is described later in detail.

The imaging device 40 is a CCD having a plurality of photoreceptors in Embodiment. Note that the imaging device 40 is not limited to a CCD.

Figure 5:
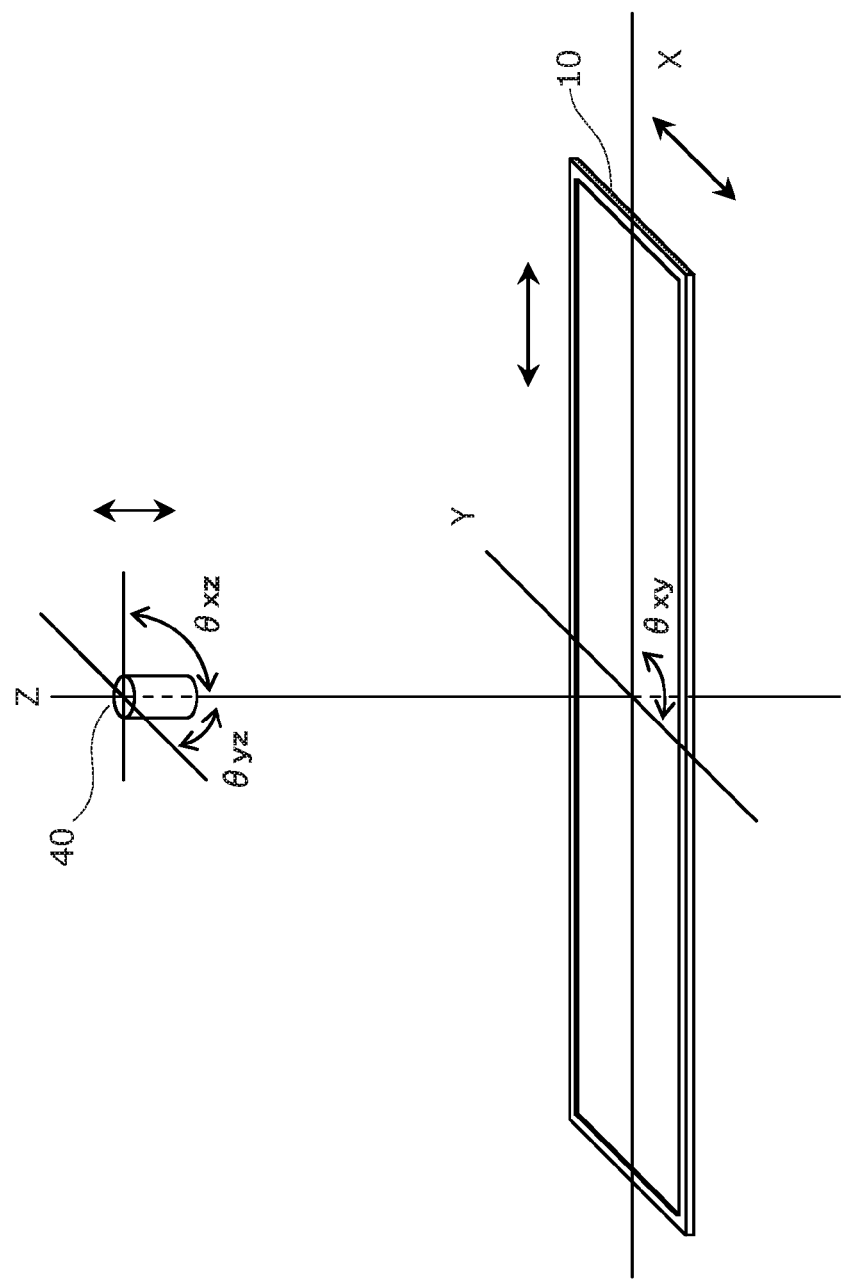
FIG. 5 is a schematic diagram showing a positional relationship between the imaging device and the organic EL panel.

FIG. 5 is a schematic diagram showing a positional relationship between the imaging device 40 and the organic EL panel 10 and also showing movement methods thereof. In FIG. 5, axes X, Y, and Z are drawn to cross orthogonally each other for the sake of explanation. However, these axes do not necessarily cross orthogonally.

In the initial state as in FIG. 5, the imaging device 40 is located above the organic EL panel 10 with a lens facing the organic EL panel and an axis orthogonally crossing the lens being parallel with the axis Z.

The panel moving mechanism 50 causes the organic EL panel 10 mounted on the inspection apparatus 30 to move. As shown in FIG. 5, the panel moving mechanism 50 enables the organic EL panel 10 to move in the directions of the X and Y axes while maintaining the organic EL panel 10 horizontally on an XY-plane. Moreover, the panel moving mechanism 50 enables the organic EL panel 10 to turn in a direction in the XY-plane. The alignment unit 37 determines an amount of movement in the directions of the X and Y axes and an angle θxy, and then outputs the result of this determination to the panel moving mechanism 50.

The imaging-device moving mechanism 60 causes the imaging device 40 to move. As shown in FIG. 5, the imaging-device moving mechanism 60 enables the imaging device 40 to move in a direction perpendicular to the axis Z. Moreover, the imaging-device moving mechanism 60 enables the imaging device 40 to tilt (or, turn) in a direction parallel to an XZ-plane (that is, a θxz direction) and a direction parallel to a YZ-plane (that is, a θyz direction). The alignment unit 37 determines an amount of movement in the direction of the Z axis and angles θxz and θyz, and then outputs the result of this determination to the imaging-device moving mechanism 60.

Each of the structural elements in the inspection apparatus 30 (i.e., the image processing unit 31, the signal generation unit 35, the imaging unit 36, and the alignment unit 37) may be configured in the form of an exclusive hardware product. Alternatively, each of the structural elements in the inspection apparatus 30 may be realized by means of a program executing unit, such as a central processing unit (CPU) and a processor, reading and executing the software program recorded on a recording medium such as a hard disk or a semiconductor memory.

[3. Lighting Inspection Performed on Driver-Mounted Organic EL Panel]

Figure 6:
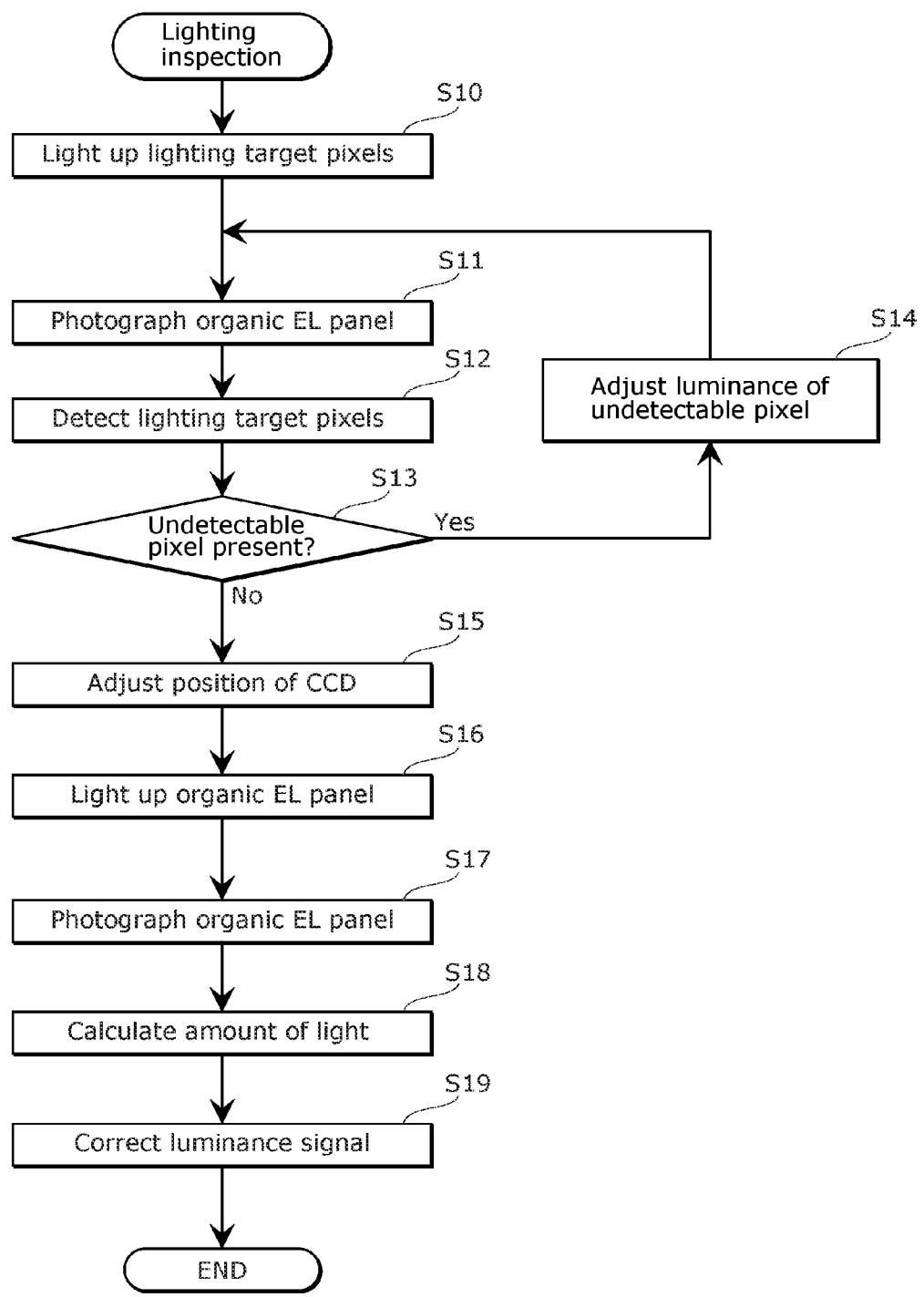
FIG. 6 is a flowchart showing an example of processing procedures of lighting inspection performed on the organic EL panel.

The lighting inspection performed on the organic EL panel 10 with the driver 20 mounted thereon (that is, the method of manufacturing an organic EL display) is described, with reference to FIG. 6.

FIG. 6 is a flowchart showing an example of processing procedures of the aforementioned lighting inspection performed on the organic EL panel. In FIG. 6, steps S10 to S15 correspond to the alignment process while steps S16 to S19 correspond to the correction process to make the organic EL panel 10 uniform in the amount of luminescence.

In Embodiment, when the organic EL panel 10 is oversized, the inspection apparatus 30 divides the light emitting pixel P of the oversize organic EL panel 10 into nine (3×3) rectangular partitions with about the same size. After this, the inspection apparatus 30 sets these partitions as processing target areas one by one to perform the processing shown in FIG. 6.

When the lighting inspection starts, the signal generation unit 35 of the inspection apparatus 30 outputs an alignment signal to cause the lighting target pixels to light up, to the driver 20 of the organic EL panel 10 (step S10). In the initial state, all the lighting target pixels receive the same alignment signal. In view of the amount of current passing through the organic EL element OEL (shown in FIG. 3), an initial value of the alignment signal is set to, for example, a median value in the range of possible luminance values, instead of the highest luminance value.

In Embodiment, four light emitting pixels P1 located at four corners of the organic EL panel 10 are set as the lighting target pixels. Moreover, light emitting pixels P located other than on the periphery of the organic EL panel 10 are set as additional lighting target pixels in Embodiment.

FIG. 7 is a diagram showing an example of a setting of lighting target pixels. For the sake of explanation, only a processing target region instead of the whole of the organic EL panel 10 is shown in FIG. 7. In FIG. 7, the following are set as the lighting target pixels: the four light emitting pixels P1 located at the four corners of the processing target region; light emitting pixels P2 located at four corners of a rectangle; and light emitting pixels P3 arranged in a cross. The light emitting pixels P2 and P3 are the additional lighting target pixels.

More precisely, assume that a rectangle L2 smaller than the organic EL panel 10 in size is set in the center of the organic EL panel 10. In such a case, the light emitting pixels P2 are the four light emitting pixels located at the four corners of the rectangle L2.

Assume that a cross L3 having the center aligned with the center of the organic EL panel 10 is set. In such a case, the light emitting pixels P3 include the following: four light emitting pixels through which the lines of the cross L3 pass and which are in contact with the frame of the organic EL panel 10; and four light emitting pixels through which the lines of the cross L3 and the sides of the rectangle L2 pass.

The lighting target pixels such as the light emitting pixels P1, P2, and P3 are set as described. Then, the alignment is performed to minimize the amount of displacement of the individual pixel with respect to the corresponding photoreceptor of the CCD. This can reduce an influence caused by lens aberration of the imaging device 40.

Note that more than one rectangle may be set, and that more than one cross may be set. The lighting target pixels are set appropriately in accordance with, for example, the type of lens mounted on the imaging device.

The imaging unit 36 controls the imaging device 40, causing the imaging device 40 to photograph the organic EL panel 10 (step S11). The imaging unit 36 photographs the processing-target light emitting pixels P as a whole, among the light emitting pixels P making up the organic EL panel 10. Moreover, while the lighting target pixels are lighting up, that is, while the signal generation unit 35 is outputting the alignment signal, the imaging unit 36 causes the imaging device 40 to photograph the organic EL panel 10. Receiving the photographed image from the imaging device 40, the imaging unit 36 outputs this photographed image to the lighting-target-pixel detection unit 32.

Receiving the photographed image from the imaging unit 36, the lighting-target-pixel detection unit 32 detects the lighting target pixels from the photographed image (step S12). To be more specific, as an example, the lighting-target-pixel detection unit 32 uses the photographed image to calculate the luminance value for each pixel included in the photographed image, and specifies a light emitting pixel P (as a detected pixel) that has the luminance value greater than a predetermined threshold.

The lighting-target-pixel detection unit 32 determines whether an undetectable pixel is present (step S13). This determination of whether an undetectable pixel is present is made, for example, by determining whether the number of detected pixels is the same as the number of set lighting target pixels.

When determining that an undetectable pixel is present ("Yes" in step S13), the lighting-target-pixel detection unit 32 specifies the undetectable pixel and outputs information about this undetectable pixel to the signal generation unit 35.

The undetectable pixel is specified according to the following method, for example. The lighting-target-pixel detection unit 32 previously obtains information that indicates the correct positions that should be detected as the positions of the lighting target pixels in the photographed image. For example, from the position of the detected pixel in the photographed image, the lighting-target-pixel detection unit 32 specifies one of the lighting target pixels, to which this detected pixel corresponds to. To be more specific, for example, the lighting target pixel corresponding to the correct position, among the correct positions that should be detected, which is closest to the current detected pixel may be specified as the lighting target pixel corresponding to the current detected pixel. Alternatively, the detected pixel away from the correct position within a predetermined range may be specified as the detected pixel corresponding to the lighting target pixel corresponding to this correct position.

The lighting-target-pixel detection unit 32 specifies, as the undetectable pixel, the lighting target pixel determined to have no corresponding detected pixel, among the lighting target pixels. Then, the lighting-target-pixel detection unit 32 outputs information identifying this undetectable pixel, such as information about coordinates of the undetectable pixel on the organic EL panel 10, to the signal generation unit 35.

Receiving the positional information about the undetectable pixel, the signal generation unit 35 corrects the alignment signal to increase the amount of luminescence of this undetectable pixel (step S14). As a result, the amount of luminescence of the undetectable pixel on the organic EL panel 10 increases accordingly. Note that the amount of luminescence is increased by a constant amount in Embodiment. In other words, the luminance value of the alignment signal is increased by a constant increment.

After the correction of the alignment signal, the processing proceeds to photographing of the organic EL panel 10 (step S11). Until it is determined in step S13 that no undetectable pixel is present, the processing repeats the photographing of the organic EL panel 10 (step S11), the detecting of the lighting target pixels (step S12), and the determining of an undetectable pixel (step S13).

When it is determined that no undetectable pixel is present ("No" in step S13), the lighting-target-pixel detection unit 32 outputs information required for the alignment to the alignment unit 37. The information required for the alignment includes positional information of all the lighting target pixels in the photographed image, for example.

The alignment unit 37 adjusts the position of the CCD (step S15). For example, the alignment unit 37 equalizes, among all the light emitting pixels P, the amounts of displacement between the actual detected positions of the lighting target pixels in the photographed image and the respective correct positions of the lighting target pixels. More precisely, for example, the alignment unit 37 calculates the following, in such a way to minimize a peak distance value or a mean square error of the distance: the position of the CCD in the Z-axis direction and the angles $\theta xz$ and $\theta yz$ of the CCD; and the rotation angle $\theta xy$ of the organic EL panel 10 and positions of the organic EL panel 10 in the X-axis and Y-axis directions. After this, the alignment unit 37 outputs the information used to move the CCD and the organic EL panel 10, to the imaging-device moving mechanism 60 and the panel moving mechanism 50.

After the alignment, the signal generation unit 35 outputs, to the organic EL panel 10, an inspection signal to measure the amount of luminescence of the organic EL panel 10 (step S16).

When the signal generation unit 35 outputs the inspection signal, the imaging unit 36 causes the imaging device 40 to photograph the organic EL panel 10 and then obtains the photographed image (step S17). Receiving the photographed image from the imaging device 40, the imaging unit 36 outputs this photographed image to the light amount detection unit 33.

Receiving the photographed image, the light amount detection unit 33 uses the photographed image to calculate the amount of light for each of the light emitting pixels P making up the organic EL panel 10 (step S18). To be more specific, the luminance value of the individual pixel in the photographed image is calculated as the amount of luminescence of the corresponding light emitting pixel P. For the pixels corresponding to a single light emitting pixel P, a mean value or a median value may be calculated as the amount of luminescence, for example.

The correction amount calculation unit 34 calculates the correction amount for the luminance signal, using the luminescence amount information (step S19).

4. Advantageous Effects, Etc.

According to the method of manufacturing an organic EL display in Embodiment described above, when a lighting target pixel cannot be detected in the alignment of the imaging device, the luminance signal (the alignment signal) for this lighting target pixel is corrected to increase the amount of luminescence. This enables the lighting target pixel to be detected more favorably.

Moreover, with a structure in which the amount of luminescence is increased sequentially until the lighting target pixel is detected, the lighting target pixel can be detected more reliably.

Furthermore, according to the method of manufacturing an organic EL display in Embodiment described above, the lighting target pixels are set not only at the four corners of the processing target region, but also at the four corners of the rectangle L2 as well as on the cross L3. This can reduce an influence caused by lens aberration of the imaging device 40.

(Other Embodiments)

(1) In Embodiment above, after the positioning is performed on the imaging device 40 and the organic EL panel 10 (step S15), the processes from the lighting-up of the organic EL panel (step S16) to the correcting of the luminance signal (step S19) are performed. However, the processing procedure is not limited this. After the alignment (step S15), only the lighting target pixels may be lit up again to photograph the organic EL panel to determine whether the alignment has been performed normally.

(2) In Embodiment above, the light emitting pixel P of the organic EL panel 10 is divided into nine, i.e., 3×3, partitions, for each of which the processing shown in FIG. 6 is performed. However, the pixel division is not limited to this. The number of partitions may be freely set in accordance with the size of the organic EL display.

Moreover, instead of dividing the light emitting pixel P of the organic EL panel, the imaging device 40 may photograph all the light emitting pixels Ps in a single shot. In this case, the imaging device 40 is an image device that has the resolution (the number of photoreceptors) greater than the number of light emitting pixels P of the organic EL panel 10 with the highest precision where the inspection apparatus 30 can inspect. This enables all the light emitting pixels P of the organic EL panel 10 to be inspected by means of a single shot.

Furthermore, in Embodiment above, when the lighting inspection is available to organic EL panels with different sizes, for example, at least one of the corners of the rectangle L2 may be set to align with one of the corners of each of these different-sized organic EL panels 10 except for the largest one.

Assume, as an example, that the lighting inspection is available to a 60-inch organic EL panel 10 and a 50-inch organic EL panel 10. In this case, the upper-left light emitting pixel P of the 50-inch organic EL panel 10 may be set to align with the upper-left corner of the rectangle L2. Similarly, the size and position of the rectangle L2 may be set so that the upper-right, lower-left, and lower-right light emitting pixels P of the 50-inch organic EL panel 10 align with the upper-right, lower-left, and lower-right corners of the rectangle L2.

(3) In Embodiment above, the alignment (steps S10 to S15) is achieved by simultaneously photographing the following: (a) the light emitting pixels P located at the four corners; (b) the light emitting pixels P located at the four corners of the small rectangle; and (c) the light emitting pixels P arranged in the cross. However, the photographing and the alignment may be performed sequentially. To be more specific, after the processes from the photographing to the alignment (steps S10 to S15) performed on (a) the light emitting pixels P located at the four corners, the processes may be performed on (b) the light emitting pixels P located at the four corners of the small rectangle or (c) the light emitting pixels P arranged in the cross.

(4) Embodiment above describes the alignment performed in the lighting inspection, as an example. However, the process is not limited to this. For example, the present disclosure may be applied to another manufacturing process, such as blinking inspection, performed using the imaging device before the lighting inspection (that is, before the correction of the amount of luminescence).

(5) In Embodiment above, steps S11 to S14 in the lighting inspection of FIG. 6 are repeated until no undetectable pixel is present.

Here, when an undetectable pixel is present even with the alignment signal having the highest value, for example, a substitute lighting target pixel may be set. The substitute lighting target pixel may be a pixel adjacent to the undetectable pixel, for example.

In this case, the processes from step S11 to step S14 may be repeated for the substitute lighting target pixel. Moreover, more than one substitute lighting target pixel may be prepared. In this case, until a detectable light emitting pixel is found, the substitute lighting target pixels may be selected one by one in order of priority.

(6) Each of the structural elements in each of the above-described embodiments may be configured in the form of an exclusive hardware product, or may be realized by executing a software program suitable for the structural element. Each of the structural elements may be realized by means of a program executing unit, such as a CPU and a processor, reading and executing the software program recorded on a recording medium such as a hard disk or a semiconductor memory.

Although methods of manufacturing organic EL display apparatuses according to one or more exemplary embodiments have been described thus far based on the embodiments, the present disclosure is not limited to such embodiments. For example, forms obtainable by performing various modifications on the respective embodiments that may be conceived by a person of ordinary skill in the art as well as forms realized by arbitrarily combining the structural elements in the embodiments without departing from the scope of the teachings of the present disclosure may be included in the one or more exemplary embodiments.

INDUSTRIAL APPLICABILITY

The present disclosure can be applied to a method of manufacturing an organic EL display apparatus.

REFERENCE SIGNS LIST

10 Organic EL panel
20 Driver
21 Data line drive circuit
22 Scanning line drive circuit
30 Inspection apparatus
31 Image processing unit
32 Lighting-target-pixel detection unit
33 Light amount detection unit
34 Correction amount calculation unit
35 Signal generation unit
36 Imaging unit
37 Alignment unit
40 Imaging device
50 Panel moving mechanism
60 Imaging-device moving mechanism
P, P1, P2, P3 Light emitting pixels
GL Scanning line
SL Data line
T1 Selection transistor
T2 Drive transistor
OEL Organic EL element
C1 Capacitive element
N1 Node

The invention claimed is:

1. A method of manufacturing an organic electroluminescent (EL) display apparatus that includes a display panel having light emitting pixels each of which has a light emitting element, the method comprising:
lighting up lighting target pixels set from among the light emitting pixels;
causing an imaging device to photograph the display panel and receiving a photographed image from the imaging device;
detecting the lighting target pixels using the photographed image;
determining whether an undetectable pixel that cannot be detected is included among the lighting target pixels, using a result obtained in the detecting of the lighting target pixels;
increasing an amount of luminescence of the undetectable pixel to an amount of luminescence detectable in the detecting of the lighting target pixels, when it is determined that the undetectable pixel is included; and
aligning a relative position of the organic EL display apparatus and the imaging device, using the result obtained in the detecting of the lighting target pixels.

2. The method of manufacturing an organic EL display apparatus according to claim 1,
wherein in the lighting up of lighting target pixels, four first light emitting pixels and an additional lighting target pixel are set as the lighting target pixels, the four first light emitting pixels being located at four corners of the display panel and the additional lighting target pixel being located other than on a periphery of the display panel.

3. The method of manufacturing an organic EL display apparatus according to claim 2,
wherein in the lighting up of lighting target pixels, when a rectangle smaller than the display panel is set in a center of the display panel, a second light emitting pixel included among the light emitting pixels and located at at least one of four corners of the rectangle is set as the additional lighting target pixel.

4. The method of manufacturing an organic EL display apparatus according to claim 2,
wherein in the lighting up of lighting target pixels, when a cross is set on the display panel, a freely-selected third light emitting pixel included among the light emitting pixels and located on the cross is set as the additional lighting target pixel.

5. The method of manufacturing an organic EL display apparatus according to claim 1,
wherein in the determining, a lighting target pixel that is included among the lighting target pixels and has a luminance value not more than a predetermined threshold in the photographed image is determined to be the undetectable pixel.

6. The method of manufacturing an organic EL display apparatus according to claim 1,
wherein in the increasing of an amount of luminescence of the undetectable pixel, a luminance value of the undetectable pixel is increased by a predetermined constant increment, and
until it is determined in the determining that the undetectable pixel is not present, the increasing of an amount of luminescence, the causing of an imaging device to photograph the display panel, the detecting of the lighting target pixels, and the determining are repeated in stated order.

7. The method of manufacturing an organic EL display apparatus according to claim 6,
wherein the aligning of a relative position is performed after it is determined in the determining that the undetectable pixel is not present.

8. The method of manufacturing an organic EL display apparatus according to claim 1,
wherein in the aligning of a relative position, the relative position is determined to minimize, among all the lighting target pixels, a total amount of displacement between actual detected positions of the lighting target pixels in the photographed image and respective correct positions of the lighting target pixels in the photographed image.

9. The method of manufacturing an organic EL display apparatus according to claim 1, further comprising
setting a substitute lighting target pixel for the undetectable pixel determined to be undetectable in the determining performed after the amount of luminescence of the undetectable pixel is increased to a highest amount in the increasing of an amount of luminescence of the undetectable pixel,
wherein the increasing of an amount of luminescence, the causing of an imaging device to photograph the display panel, the detecting of the lighting target pixels, and the determining are performed for the substitute lighting target pixel.

10. An inspection apparatus for an organic electroluminescent (EL) display apparatus that includes a display panel having light emitting pixels each of which has a light emitting element, the inspection apparatus comprising:
a signal generation unit configured to light up lighting target pixels set from among the light emitting pixels;
an imaging unit configured to cause an imaging device to photograph the display panel and receive a photographed image from the imaging device;
a lighting-target-pixel detection unit configured to detect the lighting target pixels using the photographed image and determine, using a result obtained in the detection of the lighting target pixels, whether an undetectable pixel that cannot be detected is included among the lighting target pixels; and
an alignment unit configured to align a relative position of the organic EL display apparatus and the imaging device, using the result obtained in the detection of the lighting target pixels,
wherein when the lighting-target-pixel detection unit determines that the undetectable pixel is included, the signal generation unit is configured to increase an amount of luminescence of the undetectable pixel to an amount of luminescence detectable by the lighting-target-pixel detection unit.

* * * * *